US006497581B2

(12) United States Patent
Slocum et al.

(10) Patent No.: US 6,497,581 B2
(45) Date of Patent: Dec. 24, 2002

(54) ROBUST, SMALL SCALE ELECTRICAL CONTACTOR

(75) Inventors: Alexander H. Slocum, Bow, NH (US); R. Scott Ziegenhagen, Bedford, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/012,837

(22) Filed: Jan. 23, 1998

(65) Prior Publication Data

US 2002/0053463 A1 May 9, 2002

(51) Int. Cl.[7] .......................... H01R 12/00; H05K 1/00

(52) U.S. Cl. .......................... 439/66; 439/591; 439/81; 439/83

(58) Field of Search .......................... 439/66, 591, 81, 439/83; 174/256

(56) References Cited

U.S. PATENT DOCUMENTS

| | | | |
|---|---|---|---|
| 4,419,626 A | 12/1983 | Cedrone et al. | 324/158 P |
| 4,574,235 A | 3/1986 | Kelly et al. | 324/158 F |
| 4,747,784 A | 5/1988 | Cedrone | 439/71 |
| 4,773,877 A | 9/1988 | Kruger et al. | 439/482 |
| 4,866,374 A | 9/1989 | Cedrone | 324/158 F |
| 4,956,604 A | 9/1990 | Cedrone | 324/158 F |
| 5,047,740 A | 9/1991 | Alman | 335/4 |
| 5,086,337 A | 2/1992 | Noro et al. | 257/726 |
| 5,152,695 A | * 10/1992 | Grabbe et al. | 439/71 |
| 5,173,055 A | 12/1992 | Grabbe | 439/66 |
| 5,228,861 A | 7/1993 | Grabbe | 439/66 |
| 5,479,110 A | 12/1995 | Crane et al. | 324/757 |
| 5,552,563 A | 9/1996 | Conder et al. | 174/35 R |
| 5,557,212 A | 9/1996 | Isaac et al. | 324/755 |

FOREIGN PATENT DOCUMENTS

| | | |
|---|---|---|
| GB | 2 291 544 A | 1/1996 |
| WO | 96/15459 | 5/1996 |
| WO | 96/16440 | 5/1996 |

OTHER PUBLICATIONS

Giga Family. *Johnstech International*, May 1997.
Leung et al. Active Substrate Membrane Probe Card, 1995.
Yi et al. A Microwave Active Probe Device Compatible with SOI–CMOS Technologies. *Journal of Microelectromechanical Systems*, vol. 6, No. 3 Sep. 1997.

* cited by examiner

*Primary Examiner*—Hung V. Ngo
(74) *Attorney, Agent, or Firm*—Edmund J. Walsh

(57) ABSTRACT

A contactor for use in testing integrated circuit chips. The contactor is made with an array of V-shaped contact elements. The V-shaped contact elements are nested so that the contact elements can be longer than the pitch of the contact points. In this way, the compliance of the beam portions of the contact elements can be increased. Also, the V-shape is very robust. Further, the V-shape allows "fly-by" testing, which is very useful at high speeds.

20 Claims, 4 Drawing Sheets

ROBUST, SMALL SCALE ELECTRICAL CONTACTOR

This invention relates generally to electrical contactors and more specifically to improved robustness of small contactors suitable for very high frequency signals.

Integrated circuit chips are tested at least once and sometimes several times during their manufacture. In order to test the integrated circuit chips rapidly, automated handling equipment inserts the chips very rapidly into an automatic test system. The automatic test system includes a device which makes electrical contact to the integrated circuit chip, allowing the automatic test system to generate and measure electrical test signals at the chip being tested.

When the integrated circuit chips are tested after they have been packaged, the device which makes electrical contact to the chips is called a "contactor." When the integrated circuit chips are tested before they are packaged, the device which makes electrical contact is called a "probe card." A wafer containing integrated circuit chips is pressed against the probe card by an automated handling device for testing the integrated circuits on the wafer.

A contactor is generally made of conductive beams that provide compliance in one direction. Sometimes, the beams are curled to provide greater spring force in that direction. To make electrical contact, the chip to be tested is pressed against the contactor. Conductive leads or contact pads on the chip make contact with beams in the contactor such that the spring force of the beam causes electrical contact to be made with the chip.

A probe card has some similarities, though the scale is much smaller. A probe card traditionally contains an array of needle-like wires that make contact with pads on the surface of the integrated circuit chip. However, in some instances, probe cards have been made using beams that provide compliance in the direction in which the wafer is moved to press it against the probe card.

There are various limitations with existing contactors for testing packaged parts and probe cards for testing integrated circuit chips on wafers. Probe cards are generally difficult and costly to make. In addition, because the wires or beams used to make the probe cards are so small, they are fragile and can be easily damaged. The probes are designed for compliance only in one direction, specifically the direction in which the wafer is pressed against the probe card. Thus, the probe cards are particularly susceptible to damage from forces that are orthogonal to this direction.

Contactors suffer from similar limitations, but in recent years the limitations have not been as noticeable because contactors are made on a larger scale. The leads on a packaged part have traditionally been spaced much further apart than the pads inside an integrated circuit chip. However, new packaging techniques have reduced the spacing between contact points (or the "pitch") on the packaged parts. For example, one current packaging technique is called Ball Grid Array, or "BGA" packaging. A BGA package has an array of pads to which solder balls are attached. To attach the BGA package to a printed circuit board, the solder balls are aligned with conductive pads on the printed circuit board. The solder balls are heated, forming a solder joint between the pad on the chip package and the pad on the printed circuit board.

The pads on a BGA package are typically on a 1.27 mm pitch. Future BGA packages will likely be on a 0.5 mm pitch. Forming beams in a contactor that make good electrical contact with the solder balls requires that the beams have a relatively long aspect ratio. The "stroke" or amount of compliance of the beam must be sufficient to ensure that all beams press firmly against all contact points when the BGA Package is pressed against the contactor. For a given width beam, the compliance of the beam will increase as the third power of its length. However, when the pitch of the pads is very small, the length of the beams is limited. Therefore, the beams must be made very narrow and thin to provide the required aspect ratio. Thin, narrow beams are not robust and even more prone to damage. Alternatively, to provide more robustness using known designs, the beams would have to be made too short to provide enough compliance and range of motion to make good, repeatable electrical contact.

Some companies have made contactors with lay-down beams. The beams of these contactors are intended to deflect downwards, towards the substrate to which the beams are attached. However, the beams of these contactors have been so long that they can bend sideways and sometimes do not stay aligned with the contact points on the chips. Additionally, the surface of the substrate below the beams has been made as a conductor. In use, the beam is intended to be pressed down against the conductor to make a low resistance electrical path. However, in practice, it has been observed on occasion that air gaps exist between the beam and the conductor, which can alter the electrical properties of the contact element. It would be desirable to have a contact element with consistent electrical properties even if deflection of the beam is not uniform Another limitation with existing contactors and probe card designs also relates to the difficulty in making robust beams with very small pitch. In addition to being made smaller, integrated circuit chips are also operating at higher and higher frequency. The test systems that test the chips must test those chips at those high frequencies. However, at high frequencies, the transmission line effects of the connections between the test system and the chip can become a significant source of error. For example, when testing a chip, signals are sometimes measured at a test point and are at other times driven to that same test point. The test system includes, for each test point, a driver and a comparator so that a signal can be either generated or measured. If the driver and comparator are connected to the test point through the same path, the comparator can not operate until the transmission line effects from the driver have faded away. Likewise, the driver can not operate until the comparator has completed measurement, taking into account the transmission line effects. Thus, the transmission line effects limit the time between successive test operations and therefore the speed at which the test system can operate.

One way that has been used to limit the impact of the transmission line effects is called "fly by" testing. The drivers and comparators are connected to the test points through completely separate paths. In this way, the transmission line effects triggered by drive signals do not impact measurements made by the comparators. However, making completely separate paths requires two points of contact to each test point on the chip. Thus, the pitch of the contactors would be even smaller than the pitch of the test points, which increases the difficulty in providing a robust mechanical design. As a compromise between the electrical and mechanical properties, the signal paths between each test point and the drivers and comparators is separate for as much as possible, but is not separate in the contactor. Nonetheless, these designs are still limiting for frequencies of 1 GHz or above.

SUMMARY OF THE INVENTION

With the foregoing background in mind, it is an object to provide a contactor design that is on a very small scale.

It is also an object to provide a contactor design that is robust.

Further, it is an object to provide a contact design that facilitates fly-by testing.

The foregoing and other objects are achieved with a contact element having at least two conducting members that intersect at a contact point.

In a preferred embodiment, an array of contact elements is disposed on a carrier member with the conducting members interspersed, thereby reducing the pitch between contact points. In one embodiment, the contact point of one contact element is disposed between the conducting members of an adjacent contact element.

In a preferred embodiment, the conducting members of each contact element will be joined at an angle that is less than 90°.

In a preferred embodiment, one conducting member of each contact element will be connected to a driver and the other conducting member will be connected to a comparator, thereby allowing fly by testing.

BRIEF DESCRIPTION OF THE DRAWINGS

The invention will be better understood by reference to the following more detailed description and the accompanying drawings in which.

DESCRIPTION OF THE PREFERRED EMBODIMENT

Figure 1A:
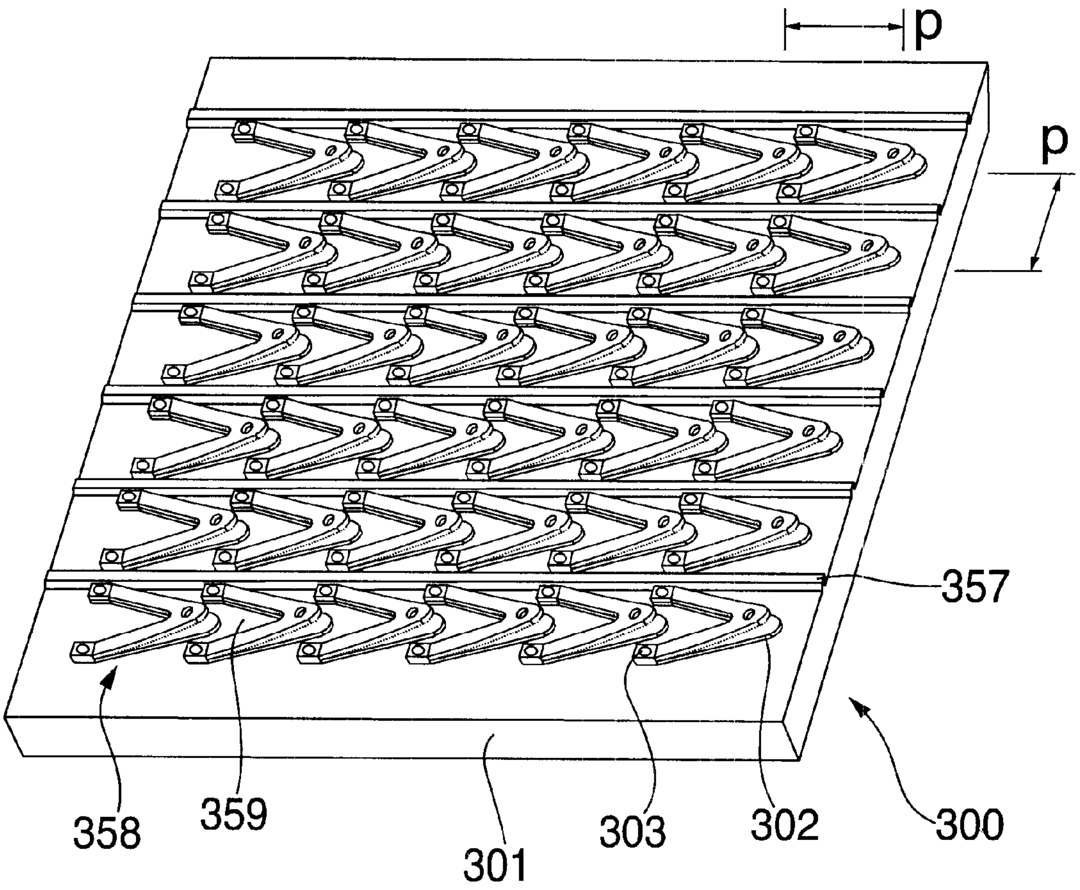
FIG. 1A shows an array of contact elements according to the invention.

FIG. 1A shows an array 300 of contact elements 358. The invention will be most useful for small contact elements. Thus, the invention might be employed to make electrical connection to packaged chips or to chips while still on wafers. Thus, the invention will be described as generally a contact element. In use, electrical connections will be made to the contact elements. In one contemplated embodiment, those electrical connections will be routed to an automatic test system.

It will be understood that the contact elements might be incorporated into a semiconductor handler. The contact elements would then probe the external connections to a packaged part. It is contemplated that the invention will be particularly useful for making contact to an array of solder balls such are traditionally used in a BGA package. Alternatively, the contact elements might be a part of probe card that directly probes semiconductor chips while still part of a wafer.

Array 300 is formed on a substrate 301. Substrate 301 is, in a preferred embodiment, a printed circuit board made according to conventional processing techniques. Electrical traces 603 within the printed circuit board are connected to pads 360 (FIG. 1B) on the surface of the printed circuit board, according to known printed circuit board fabrication techniques. The traces make electrical contact to the contact elements 358 in a manner described in greater detail below.

Each of the contact elements 358 includes attachment points 303 that make electrical contact with the pads 360 on the surface of substrate 301. Attachment points 303 might be attached to the pads 360 by soldering, welding, brazing or other known attachment method. Vias 367A and 368B carry electrical signals from each contact element 358 into substrate 301. Vias 367A and 367B make contact with the traces (not shown) in substrate 301. Vias 367A or 367B can connect to contact element 358 or simply to pads 360. Via connections to contact elements 358 allows pads 360 to be nonconductive.

Figure 1B:
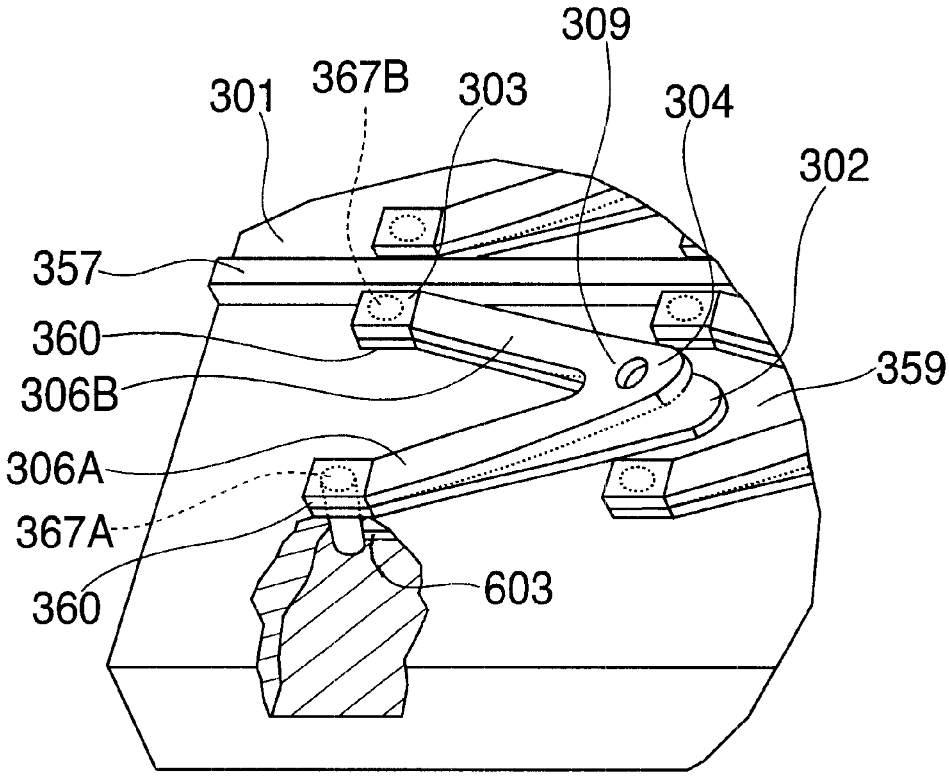
FIG. 1B shows an enlarged view of a portion of the array of contact elements in FIG. 1B.
Figure 1C:
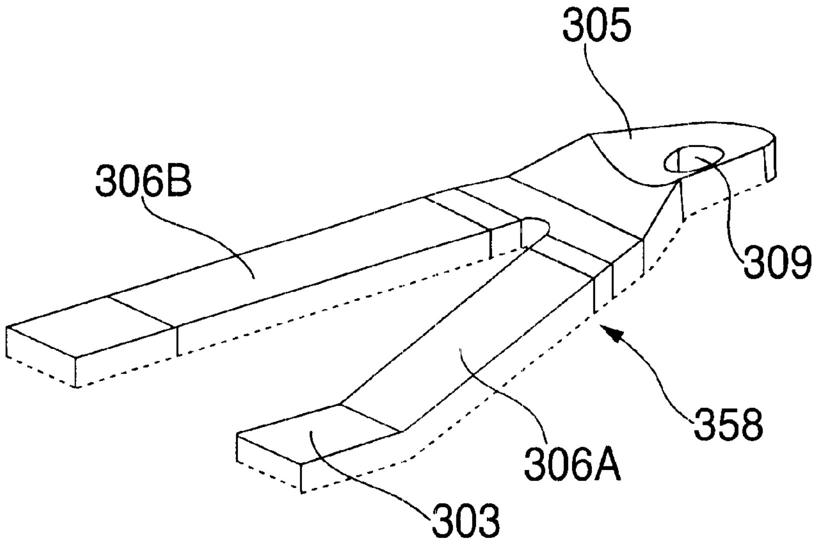
FIG. 1C shows a single contact element in greater detail.

As shown in FIG. 1C, each of the contact elements 358 is made with a pair of arms 306A and 306B. Arms 306A and 306B join at a tip 305, which serves as a contact point. The arms are joined at an angle between about 15° and about 90°. To provide the required compliance and robustness, the angle is more preferably about 30°.

Tip 305 is illustrated with a concave shape that is useful for making contact to a rounded solder ball on a BGA package. The concave shape helps precise the ball. Tip 305 will preferably be shaped to make good electrical contact with whatever surface that is to be engaged by the contact element. For example, if the contact elements 358 are to make contact with flat pads, tip 305 might be convex.

Arms 306A and 306B are bent upwards, away from the surface of substrate 301. These bends allow compliance of tip 305 in a direction perpendicular to the surface of substrate 301.

Hole 309 in tip 305 is optionally provided to ensure that contact element makes contact with a solder ball on a device under test. Hole 309 also aids in breaking through an oxide layer that might form on a solder ball to be contacted by contact element 358. As the arms 306A and 306B flex because of a solder ball being pressed against tip 305, a sharp edge (not numbered) of hole 309 will scrub across the rounded surface of the solder ball, which removes any oxide layer that might be built up on the surface of the ball.

Figure 2:
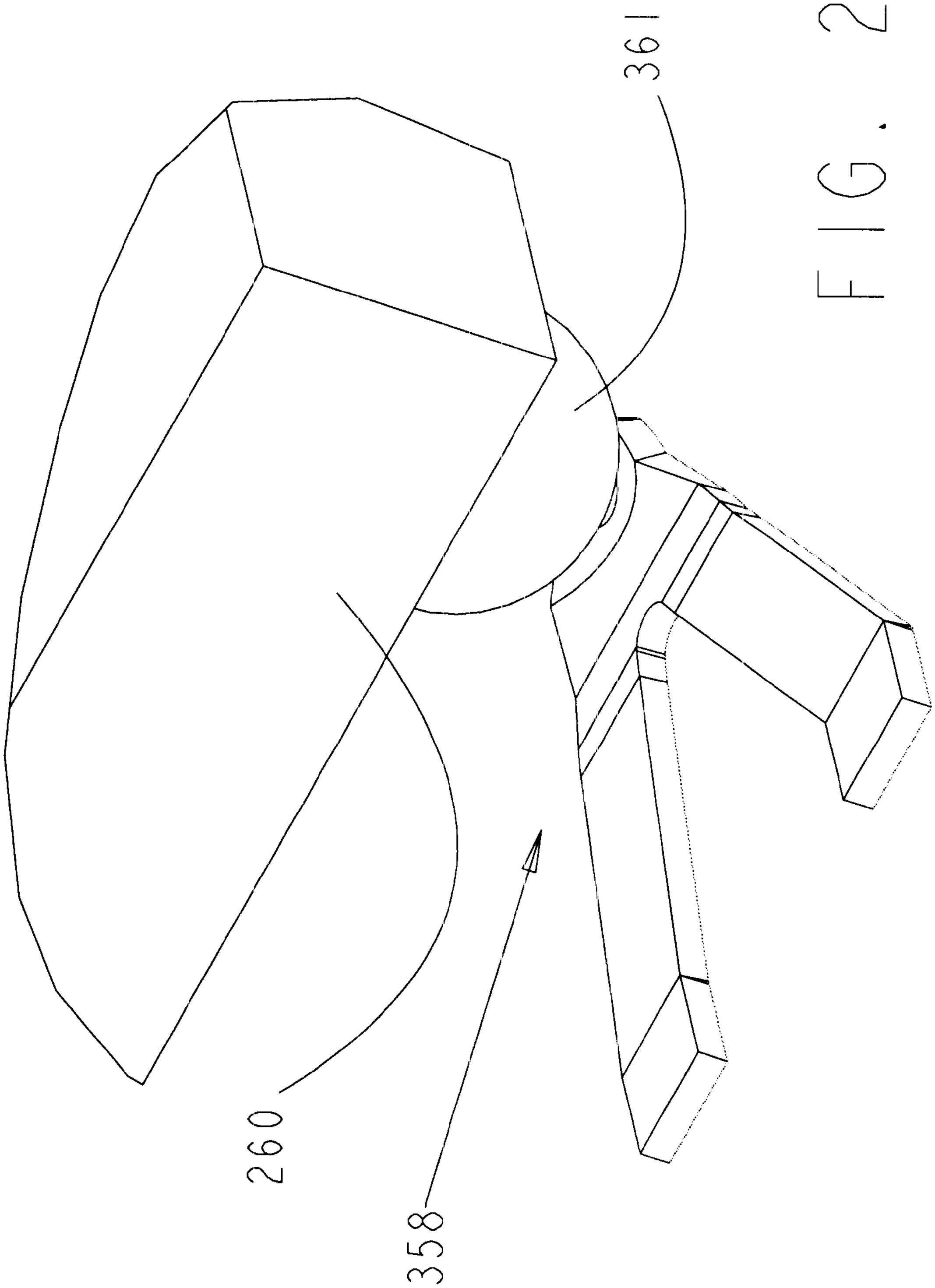
FIG. 2 shows a contact element according to the invention engaging a solder ball.

FIG. 2 shows a solder ball 361 on the underside of a chip package 260 making contact with a contact element 358. In use, there would be multiple solder balls 361 disposed in an array with pitch P, matching the pitch of array 300 of contact elements.

Returning to FIG. 1A, contact elements 358 are disposed in an array with a pitch P, between adjacent contact elements. Contact elements 358, because they are formed with two arms 306A and 306B (FIG. 1C), have an open space 359 between the arms. Thus, the arms nest, which allows them to have longer length and greater compliance. When contact elements 358 are arranged in an array, tip 305 of one contact element fits into the open space 359 of the adjacent contact element. In this way, the contact element 358 can be longer than the pitch between adjacent contact points on the integrated circuit chip under test. Thus, by nesting the contact elements 358, the allowable vertical (in a direction perpendicular to substrate 301) compliance of the contact element is increased.

FIG. 1A shows that a base material 302 may be disposed below each of the contact elements 358. Base material 302 may be electrically conductive if the upper surface of substrate 301 is an insulator. In operation, contact arms 306A and 306B would be pushed down onto base material 302, thereby making a low resistance electrical path to tip 305.

However, more preferably, the upper surface of substrate 301 is electrically conductive and connected to ground, except in the regions surrounding attachment points 303.

Base material 302 is then made of a dielectric material, which is an insulator. In use, when a ball is pressed into tip 305, arms 306A and 306B press against base material 302 and are spaced apart from the conductive upper surface of substrate 301. In this way, arms 306A and 306B form the upper conductor of microstrip transmission lines. In contrast to having the beam press down into a conducting element, having the beam press against an insulator to form the upper conductor of a microstrip transmission line yields more uniform electrical properties for the contactor, even if there are variations in the amount of deflection of the beam.

In some instances, it will be desirable to control the impedance of the transmission paths through arms 306A and 306B. Often, electrical circuits are designed to match with transmission lines having an impedance of 50 Ω. If the contact elements 358 are too close together, the impedance might deviate significantly from 50 Ω or cross talk between adjacent contact elements might lead to undesirable signal distortion. To reduce these effects, a shield element 357 can be placed between rows of contact elements 358. Where the upper surface of substrate 301 is a conductor connected to ground potential, shields 357 can be electrically connected to that surface.

Turning to FIG. 1B, an enlarged view of a portion of contact array 300 is shown. In FIG. 1B, the contact elements 358 have tips 304 that are flat. They do have holes 309 formed therethrough to facilitate good electrical contact to a solder ball on a BGA package. However, tip 304 might alternatively make contact to a pad or other type of conductive structure.

Figure 3:
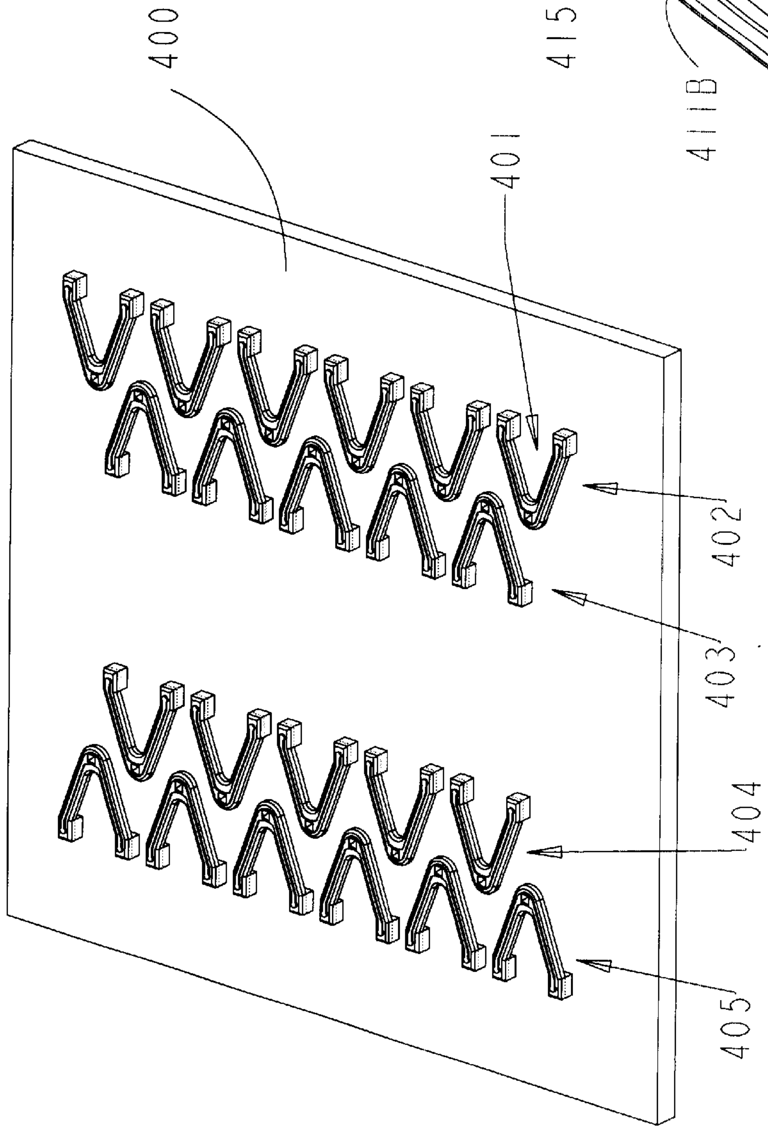
FIG. 3 shows an alternative embodiment of an array of contact elements.

FIG. 3 shows an alternative layout for contact elements in an array. Contact elements 401 are disposed on a substrate 400 in rows 402, 403, 404 and 405. The V-shaped contact elements in adjacent rows face in opposite directions. The contact elements nest with the tips of the contact elements 401 in one row nesting between the tips of contact elements in an adjacent row. Nesting in this fashion allows the "stance" of the V-shaped contact elements to be increased. The "stance" refers to the maximum spacing between arms 411A and 411B (FIG. 4), thereby increasing the angle at which the arms 411A and 411B intersect at the contact point. Increasing the stance of the contact elements 401 increases the stiffness of the contact element, thereby increasing the contact force.

Fabrication

The array 300 of contact elements 358 might be formed using a combination of known metal etching and circuit board fabrication techniques. Substrate 301 is formed using known circuit board fabrication techniques. In printed circuit board fabrication, layers of patterned metal traces are formed on layers of insulative material such as an epoxy or dielectric materials such as Kapton (which is a trademark of Dupont for a thin insulating material).

Substrate 301 can be made up with many layers of insulator and metal. To make connections between the layers, holes can be drilled through the board. The holes are then filled or plated with conductive material. These holes are sometimes called "vias." The upper surface of the substrate 301 is made with pads 360 that align with attachment points 303. The pads 360 cover vias that connect the pads to circuit traces at other payers of the printed circuit board.

The patterned metal layers can be formed by silk screening or depositing a conductive paste that can be transformed into a metal trace in a pattern. Alternatively, the patterned metal traces are formed by depositing a layer of metal and then coating it with a photosensitive layer. The photosensitive layer is exposed to light through a pattern mask, which leaves a protective layer over portions of the metal layer that matches the desired pattern of conductive traces. The metal layer is then immersed in a chemical etchant that eats away the metal, except where it has been protected by the photosensitive layer, leaving metal in the desired pattern.

Though printed circuit boards are generally fabricated with patterned metal layers and uniform layers of insulative material, similar fabrication techniques could be used to create layers that have patterns of insulative material. For example, base material 302 could be formed as an insulator by depositing an insulative material in the required pattern on a metal layer. Alternatively, a selective etching process might be used.

Preferably, the contact pads 360 on the surface of substrate 301 to which attachment points 303 are connected are the same thickness as base material 302. If necessary, multiple layers of metal are deposited on the surface of substrate 301 to make the pads.

A similar technique is used to form contact elements 358, except that they are made thin enough to be formed (bent). One suitable material to use as a base is Kapton (which is a trademark of Dupont for a thin insulating material). Copper, gold or some other type of metal can then be deposited on the Kapton. A photosensitive layer can then be formed on the metal and selectively exposed to light using a mask. The metal can then be selectively etched to leave the pattern of contact elements 358 in array 300.

The contacts 358 are formed, such as in a stamping press, to have the desired shape before they are attached to substrate 301. The stamping operation bends the contacts into the desired shape, as shown in FIG. 1B or 1C. Though the metal layer might be shaped through an etching process, the contact elements might alternatively be cut out of the metal layer in the stamping operation. The stamping also severs the Kapton layer around tip 305 and also around arms 306A and 306B. However, the Kapton layer stays intact around attachment points 303, ensuring that the array of contact elements 358 maintains the required spacing.

Once the array of contacts 358 is formed on a Kapton sheet, the sheet is positioned over substrate 301. Attachment points 303 are aligned with the conductive pads 360 on the surface of substrate 301. Attachment points 303 are then soldered, welded or brazed to the pads.

The Kapton layer can then be removed from the upper surface of the contact elements 358. The Kapton might, for example, be burned off (ablated) with a laser.

An alternative fabrication technique might be used to provide contacts on an even smaller pitch. In the embodiment of FIG. 3, it is contemplated that the pitch between contact tips is on the order of 0.1 mm. To make the contact elements on such a small pitch, it is contemplated that the contact elements 401 will formed using monolithic manufacturing techniques. Monolithic manufacturing techniques involve depositing layers of materials across the substrate and then etching away portions of the layers to leave structures with the desired shape.

Figure 4:
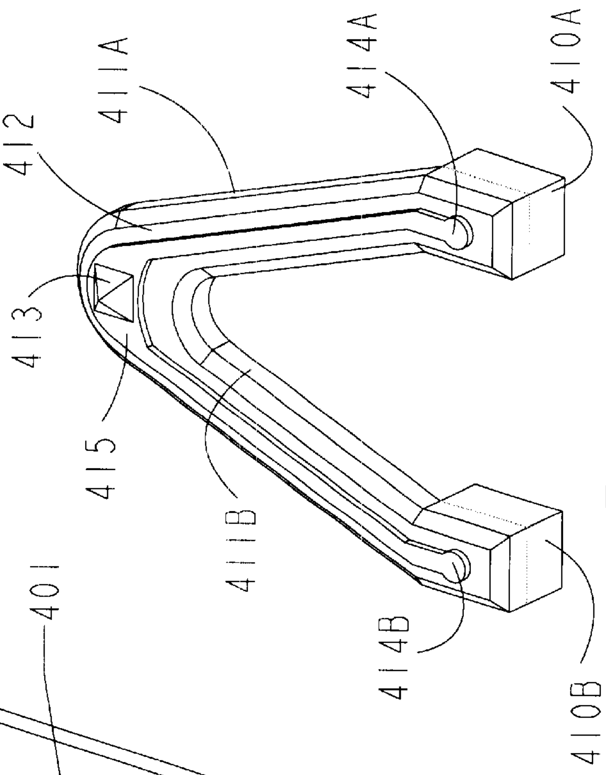
FIG. 4 is an enlarged view of one of the contact elements in FIG. 3.

If monolithic manufacturing techniques are employed, substrate 400 might, for example, be a silicon wafer. FIG. 4 shows additional details indicating how the contact elements 401 are formed. Bases 410A and 410B are first formed. Using monolithic manufacturing techniques, bases 410A and 410B are formed by depositing a layer of material across the surface of substrate 400. That layer is selectively removed to leave the bases 410A and 410B.

Depositing and then selectively removing layers is well known in the semiconductor, microelectrical mechanical device and printed circuit board fabrication arts. For example, selective removal can be achieved by applying a photosensitive coating onto the layer. A mask is used to selectively expose the photosensitive coating to light in a pattern corresponding to the shape of the portions of the layer to be retained. The light transforms the exposed portions of the photosensitive coating to leave a protective coating over the layer in a pattern that matches the desired shapes. The entire layer is then exposed to an etching solution or gas, which eats away the layer except where it is protected by the photosensitive coating. When the etching is completed, a different chemical is used to remove the photosensitive coating, leaving only structures of the desired shape.

Many materials that can be deposited in layers and then selectively removed using monolithic fabrication techniques are known to those familiar with semiconductor or printed circuit board fabrication arts. Likewise, materials for use as photosensitive coatings and etchants are likewise known, and are not critical to the invention.

Once the bases 410A and 410B are deposited, a "sacrificial layer" is deposited across the surface of substrate 400, except over bases 410A and 410B. A sacrificial layer is a layer of material that is intended to be completely etched away before the structure is complete. Another layer of material similar to what is used to form bases 410A and 410B is then deposited over substrate 400. This layer is etched to leave arms 411A and 411B.

Once arms 411A and 411B are formed, other layers can be formed over them. Another layer 412 is optionally formed over arms 411A and 411B. A metal layer 415 can then optionally be formed over layer 412. If desired, a conducting post 413 can be formed at the contact tip. Conducting post 413 can aid in making better electrical contact to a metal pad because it better pierces an oxide layer that might form over the metal pad. FIG. 4 shows that post 413 has been etched to be pointed, which will further aid in piercing an oxide layer.

Bases 410A and 410B and arms 411A and 411B could be formed of a material that is insulative or conductive. As is known in the semiconductor fabrication art, layers can be made conductive or insulative by altering the kind or amount of dopant in the material. Dopants are added through techniques such as ion bombardment or other techniques known in the art of semiconductor fabrication. Once the structure is formed, the sacrificial layer can be etched away.

In the illustrated embodiment, bases 410A and 410B and arms 411A and 411B are made of heavily doped silicon to make the structures conductive. In use, these structures would be connected to ground. Layer 412 is an insulator, such as silicon nitride. Layer 415 is a metal, such as aluminum. Post 413 could be metal or doped silicon. For this structure to function, it is necessary for a separate conductive path to be formed through bases 410A and 410B to make contact with layer 415. Such paths are formed in semiconductor similar to the way vias are formed in printed circuit boards. However, rather than drilling a hole through the layer, the layer is formed with an opening in it. The walls of the opening might be coated with an insulator and then the opening is filled with metal or other conductive material.

The structure of FIG. 4 is electrically similar to the microstrip transmission lines described in conjunction with FIGS. 1A . . . 1C. However, given the much smaller scale of the structures in FIG. 4, it will often not be necessary to use a microstrip like structure to provide the electrical characteristics. In that case, bases 410A and 410B and arms 411A and 411B might be formed from an insulative material, such as silicon without doping. A metal trace 415 might then be formed on the layer. Electrical connection to layer 415 would still be required through bases 410A and 410B.

A still simpler structure might be formed by making bases 410A and 410B and arms 411A and 411B electrically conductive, such as by using doped silicon. However, rather than connecting those elements to ground, they could be used to carry signals.

EXAMPLE

In one contemplated application, the array 300 if contact elements 358 will be made on a pitch of 0.5 mm. The contact elements 358 will be made with a length of approximately 1 mm. Contact elements 358 will be made from a copper alloy, preferably beryllium-copper, flash plated with gold. The copper will be 0.05 mm thick.

Advantages

The V-shaped contact elements 358 allow the contact elements in an array to be interleaved. Interleaving the contacts, in turn, allows the beam length to be longer. The beam length is about twice as long as the pitch between balls in an array, providing significantly greater compliance than a beam with a length equal to the pitch.

Additionally, the double beam configuration provides twice as much mating contact force as a single beam. In addition, the double beam configuration provides for a much more robust contact element. While the double beams allow compliance in a direction perpendicular to the surface of substrate 301, they prevent compliance in directions parallel with the surface of substrate 301. Thus, they are much less susceptible to damage from forces parallel to the surface of substrate 301.

The double beam configuration also provides advantageous electrical properties. Each contact element 358 has two attachment points 303, one on each leg 306A and 306B. One of attachment points can be attached to a driver inside a tester. The other attachment point can be attached to a comparator in a tester. In this way, the only overlap in the signal paths between the driver and comparator and the test point is the small are of contact element 358 exactly at the tip 305. In this way, fly-by testing can be performed without requiring multiple contact elements.

Alternative Embodiments

Having described preferred embodiments of the invention, various alternative embodiments might be constructed by one of skill in the art.

For example, substrate 301 was described as a printed circuit board. A ceramic or metal substrate might also be used.

Base material 302 is shown to be shaped to match contact element 358. However, the shape of base material 302 is not critical. A continuous layer, except around the attachment portions 303, might be used.

Also, it was described that contact elements 358 are attached at one end close to the surface of substrate 301. The tip of the contact elements are bent upwards out of the plane of the surface of substrate 301 to provide sufficient "stroke". Alternatively, contact elements 358 could be made substantially parallel to the surface of substrate 301. To provide the required stroke, the pads 360 could be elevated above the surface of substrate 301. As another alternative, contact elements 358 could be mounted parallel with the upper surface of substrate 301. To provide the required stroke, wells might be formed in the substrate below the contact tips, such that the contact tips could travel into the wells.

Also, it was described that substrate 400 is silicon. Substrate 400 might be used only as a substrate for contact elements 401. However, if substrate 400 is a silicon wafer, like those used to manufacture semiconductor chips, circuit elements can be fabricated in the substrate as well. Those circuit elements might, for example, include the drivers or comparators for signals coming through the contact elements 401.

One alternative made possible by forming robust contact elements on the silicon wafers is that the contact elements might become part of integrated circuit chips being fabricated rather than part of the test system used to test those chips. If substrate 400 represents a semiconductor wafer being used to make a chip, the chip might be tested by pressing contact elements 401 against pads that are connected to an automatic test system. If the chip is tested and determined to be functioning, the chip might then be severed from the wafer and either packaged or attached to a Multi Chip Module (MCM).

Further, the array of contact elements does not need to be a square array. If, for example, contact is desired to be made to leads of a package that extend from the side of the package in a line, contact elements 358 might be disposed in a line. Tips 304 of adjacent elements would be disposed in a line. The contact elements 358 could be interleaved by making the open portion 359 of adjacent contact elements point in opposite directions.

In addition, the contact elements might be interleaved in other ways than shown in FIG. 1A. To provide optimum signal properties, it is desirable to have equal spacing between all portions of each contact element 358 and the adjacent contact element 358. An alternative arrangement might be to have the V-shaped contacts elements 358 formed in pairs. One attachment region 303 of each contact would be inserted into the open space 359 of the other V-shaped contact element.

Further, it is not necessary that the contact elements be limited to a V-shape. The V-shape is desirable because it provides compliance in a vertical (perpendicular to the substrate) direction while providing the robustness to withstand forces in other directions. In some instances, it might be necessary to provide a contact element that provides compliance in multiple directions. Alternative shapes for the contact element that provides compliance in additional directions are described in my copending U.S. patent application entitled SMALL CONTACTOR FOR TEST PROBES, CHIP PACKAGING AND THE LIKE, filed simultaneously herewith and hereby incorporated by reference.

What is claimed is:

1. Contacting apparatus comprising:

a) a substrate having at least one insulative layer and one layer of conductive traces;

b) a plurality of contact elements disposed on the substrate, each contact element comprising at least two conducting members, each of said conducting members having two ends, with one end of each of the conducting members electrically connected to one of the conductive traces and the other end of the conducting members connected together, the contact elements each having a contact structure thereon between the ends of the conducting members connected to the conductive traces;

c) wherein the conducting members of each of the plurality of contact elements are joined at an angle between 5° and 90°.

2. The contacting apparatus of claim 1 wherein the substrate comprises silicon having an upper surface and the plurality of conducting members comprise V-shaped, metal contact elements parallel with said upper surface of the silicon.

3. The contacting apparatus of claim 1 wherein the substrate comprises a printed circuit board.

4. The contacting apparatus of claim 1 wherein the substrate comprises an integrated circuit.

5. The contacting apparatus of claim 1 wherein the plurality of contact elements are disposed in an array having a plurality of columns, with contact elements in one column having a portion disposed between conducting members of contact elements in an adjacent column.

6. The contacting apparatus of claim 5 wherein the contact elements are disposed in rows and columns, said array additionally comprising electrically conductive shields disposed between adjacent rows of contact elements.

7. The contacting apparatus of claim 1 wherein the plurality of contact elements are disposed in an array having a plurality of columns, with the connecting ends of the conducting members of each of the contact elements defining a contact point and the contact points of the contact elements in one column being between and in line with the contact points of contact elements in an adjacent column.

8. The contacting apparatus of claim 1 wherein the substrate includes a planar surface and the conducting members are mounted parallel with and above the planar surface.

9. The contacting apparatus of claim 8 wherein the substrate comprises silicon and the conducting members comprise silicon.

10. The contacting apparatus of claim 9 wherein the substrate comprises silicon and the at least one layer of conductive traces comprises semiconductor electrical circuits formed in the silicon.

11. The contacting apparatus of claim 9 wherein each conducting member comprises silicon having a metal trace disposed thereon.

12. The contacting apparatus of claim 9 wherein each conducting member comprises doped silicon.

13. The contacting apparatus of claim 1 wherein said other ends of the conducting members connected together of each of the contact elements define a probe tip and the probe tip is shaped with a concave surface.

14. The contacting apparatus of claim 1 additionally comprising:

a) a ground plane formed on the substrate;

b) a dielectric layer disposed between the ground plane and the plurality of contact elements; and c) a plurality of signal feed-throughs running through the ground plane and the dielectric, each signal feed-through connecting a conducting member to one of the conductive traces within the substrate.

15. Contacting apparatus comprising:

a) a substrate having at least one insulative layer and one layer of conductive traces;

b) a plurality of contact elements disposed on the substrate, each contact element comprising at least two conducting members, each of said conducting members having two ends, with one end of each of the conducting members electrically connected to one of the conductive traces and the other end of the conducting members connected together;

c) wherein said other ends of the conducting members connected together of each of the contact elements define a probe tip and the probe tip is shaped with a concave surface; and d) wherein each probe tip has a hole formed therein.

16. Contacting apparatus comprising:

a) a substrate having a surface extending in a first direction and a second, orthogonal direction and a plurality of conductive traces;

b) a plurality of contact elements disposed above the surface of the substrate, each contact element comprising at least a conducting member having:

i) at least two terminal portions;

ii) a central portion having a first end and a second, with each of the first and second ends connected to one of the two terminal portions;

iii) at least one bend in the central portion;

iv) a contact structure at the central portion;

iv) wherein each of the two terminal portions of the conducting member is electrically connected to one of the conductive traces; and v) wherein the conducting member extends above the substrate in the first direction and the second direction, with the terminal portions of the conducting member offset from each other in the first direction and the contact structure offset from the terminal portions in the second orthogonal direction.

17. The contacting apparatus of claim 16 wherein the conducting member has at least two substantially straight segments.

18. The contacting apparatus of claim 16 wherein the substrate is a card adapted for use as a probe card for fly-by testing.

19. The contacting apparatus of claim 16 wherein the contact structures of adjacent contact elements are spaced by less than 1.3 mm.

20. The contacting apparatus of claim 16 wherein the contact structures is V-shape.

* * * * *